(12) United States Patent
Den Boef et al.

(10) Patent No.: US 7,030,961 B2
(45) Date of Patent: Apr. 18, 2006

(54) LITHOGRAPHIC APPARATUS, DEVICE MANUFACTURING METHOD, AND DEVICE MANUFACTURED THEREBY

(75) Inventors: Arie Jeffrey Den Boef, Waalre (NL); Everhardus Cornelis Mos, Eindhoven (NL); Maurits Van Der Schaar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 170 days.

(21) Appl. No.: 10/735,856

(22) Filed: Dec. 16, 2003

(65) Prior Publication Data

US 2004/0174508 A1  Sep. 9, 2004

(30) Foreign Application Priority Data

Dec. 16, 2002 (EP) .................................. 02080336

(51) Int. Cl.
  G03B 27/42  (2006.01)
  G03B 27/52  (2006.01)
(52) U.S. Cl. .......................................... 355/53; 355/55
(58) Field of Classification Search .................. 355/52, 355/53, 55, 67–71; 356/399–401; 250/201, 250/548; 430/5, 22, 30
See application file for complete search history.

(56) References Cited

U.S. PATENT DOCUMENTS

| 4,103,998 | A | * | 8/1978 | Nakazawa et al. ..... 356/139.07 |
| 5,801,390 | A | | 9/1998 | Shiraishi |
| 5,969,428 | A | * | 10/1999 | Nomura et al. ............. 257/797 |
| 6,064,486 | A | * | 5/2000 | Chen et al. .................. 356/401 |
| 6,297,876 | B1 | | 10/2001 | Bornebroek |
| 6,481,003 | B1 | * | 11/2002 | Maeda ......................... 716/21 |
| 6,559,924 | B1 | * | 5/2003 | Ina et al. ...................... 355/53 |
| 2004/0130690 | A1 | * | 7/2004 | Koren et al. .................. 355/53 |

OTHER PUBLICATIONS

European Search Report for EP 02 08 0336 completed Dec. 4, 2003.
Article entitled Exploiting Structure in Positioning of Non-Symmetric Signals, written by Ghazanfarian et al.

* cited by examiner

*Primary Examiner*—Henry Hung Nguyen
(74) *Attorney, Agent, or Firm*—Pillsbury Winthrop Shaw Pittman, LLP

(57) ABSTRACT

During device manufacturing, a beam of radiation is projected onto a substrate via a mask. The substrate is aligned with the mask using an alignment structure on the substrate, with properties of the light reflected from (or transmitted by) the alignment structure being used to determine the relative position of the substrate. Earlier processing of the substrate may cause errors in the position determined from the reflected light. In one embodiment of the invention, measurement of properties of the reflected light are used to determine a correction for errors caused by processing of the substrate. Parameters of a physical model of the alignment structure may be estimated from the reflected light and used to determine the correction. Amplitudes of a plurality of different diffraction peaks may be measured to determine the correction.

34 Claims, 2 Drawing Sheets

LITHOGRAPHIC APPARATUS, DEVICE MANUFACTURING METHOD, AND DEVICE MANUFACTURED THEREBY

RELATED APPLICATIONS

This application claims priority to European Patent Application EP 02080336.7, filed Dec. 16, 2002, which document is herein incorporated by reference.

FIELD OF THE INVENTION

The present invention relates-to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

A lithographic apparatus may include an alignment subsystem, e.g. to accurately measure a relative position of a substrate and a patterning structure. However, the inventors have discovered that processing operations performed on the substrate (e.g. prior to alignment) may affect the accuracy of an alignment operation.

SUMMARY

A device manufacturing method according to one embodiment of the invention includes using a patterning structure to pattern a beam of radiation according to a desired pattern and determining a position, relative to the patterning structure, of an alignment structure having spatially periodically variable optical properties. The determined position is based on positional information from light affected by a substrate having the alignment structure.

The method also includes controlling a relative positioning of the patterning structure and the substrate, based on the position. Determining a position also includes obtaining position-invariant information from the light affected by the substrate; and determining, based on the position-invariant information, a correction to a determination of a position of an alignment structure of at least one among (1) the substrate, (2) another substrate that has been subjected to a processing operation in common with the substrate, and (3) a further substrate that has been subjected to a further processing operation according to the same value of a processing parameter used to subject the substrate to the further processing operation. Apparatus according to embodiments of the invention are also described herein.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to provide for accurate correction of misalignment errors that may occur when a substrate is aligned after being subjected to processing (e.g. without requiring extensive calibration measurements). For example, methods and apparatus according to these or other embodiments of the invention may be used to provide for accurate correction of misalignment errors when using a phase grating alignment system.

Figure 1:
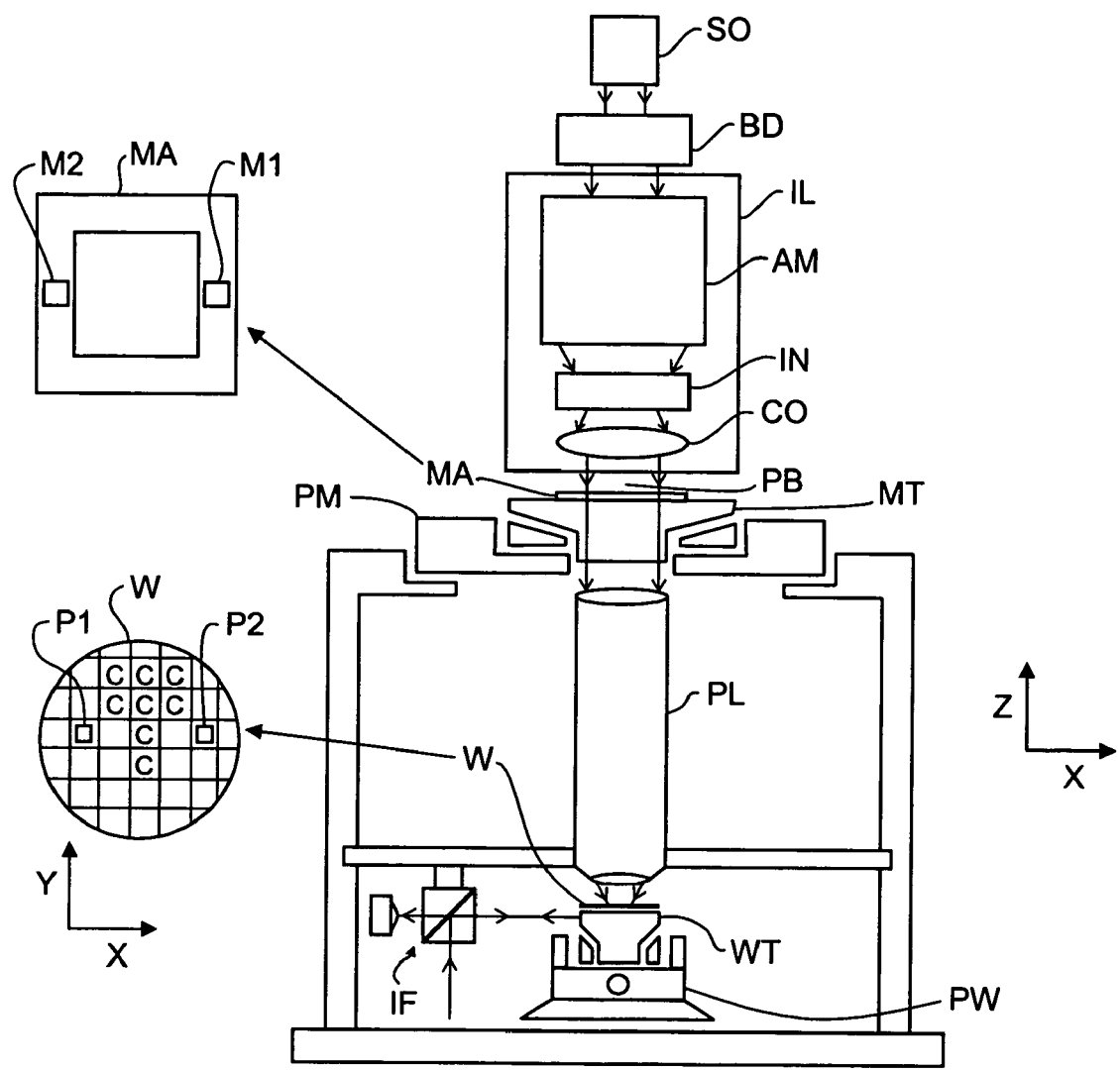
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PW for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Before the patterned beam can be projected onto substrate W, substrate W and the patterning structure have to be positioned relative to one another so that the projected beam will strike the substrate at the required target position. For this purpose, it is desirable to provide the lithographic apparatus with the capability to provide a highly accurate measurement of the position of the substrate relative to the patterning structure or the support structure for the patterning structure.

A method of aligning a substrate in a lithographic apparatus is described in an article by A. A. Ghazanfarian et al, titled "Exploiting structure in positioning of non-symmetric signals" and published in the Proceedings of the ICASSP 1998. Ghazanfarian et al use a scanning/imaging technique. An alignment mark is provided on the substrate and light scattered from the alignment mark is detected when the mark is scanned. Details of the detection technique are not disclosed, but the result is a detected signal which has lineshape with a peak as a function of scanning position. The location of the peak nominally corresponds to the position of the alignment mark.

The accuracy of this type of measurement is affected by the optical system and the processing steps to which the substrate has been subjected. In particular, systematic alignment errors arise due to asymmetry in the optical system and processing steps that affect the symmetry of structures on the substrate. These errors may vary from batch to batch (e.g. due to the effect of variations in wafer processing conditions), from wafer to wafer, or even between different positions on a wafer.

Ghazanfarian et al propose to reduce such errors by introducing a modelling step. The modelled lineshape of the detected signal as a function of a number of "hidden" parameters is used. During normal alignment, Ghazanfarian et al fit the values of the hidden parameters to best approximate the measured lineshape. The position of the alignment mark offset is determined by determining which offset must be applied to the modelled lineshape to fit it to the measured lineshape.

Prior to actual alignment, the relation between the hidden parameters and the modelled lineshape is determined, and the number of hidden parameters is selected. This step involves a learning phase in which a number of samples of alignment marks are used, of which the position is measured in some reliable way and of which the lineshape of the detection signal is measured. The samples may represent a spread of different lineshapes and offsets that are typical that may occur during normal alignment. Ghazanfarian et al use a singular value decomposition technique to generate a model capable of representing this spread and the corresponding position errors in terms of a minimum number of hidden parameters.

The technique used by Ghazanfarian et al has a number of drawbacks. First of all, during the model-forming step accurate measurements of the actual position of the alignment marks are needed. Such measurements are difficult to realize, and a considerable number of such measurements is needed during the model-forming step. A different set of measurements has to be obtained for each lithographic step during manufacturing of the substrate. This requirement makes the technique very expensive.

Secondly, the technique of Ghazanfarian et al requires a type of measurement that produces a lineshape that contains sufficient information as a function of scanning position to permit determination of sufficient hidden parameters to correct the position errors of the peak of the lineshape. This requirement excludes correction of lineshapes that contain insufficient information.

Techniques for realizing alignment may use a phase grating alignment measurement. In some of these cases, alignment marks with periodically varying optical properties are included on the substrate. Intensity of light scattered by the alignment mark is measured and the phase of observed periods of the alignment mark relative to some defined position in the lithographic apparatus is determined to measure the position of the alignment mark.

To reduce or eliminate errors, a diffraction technique may be used. In such a technique, the spatially periodic optical properties of the alignment mark lead to diffraction of light in different orders of diffraction, much as by a diffraction grating. During the phase grating alignment measurement, the alignment mark is lighted with monochromatic light and different orders of light are diffracted from the alignment mark. Light from pairs of orders is separated and used as a detection signal, of which the intensity varies periodically as a function of displacement of the alignment mark, due to the periodic nature of the alignment mark. The intensity is used to generate a detection signal, from which the position of the alignment mark is determined (e.g. up to an integer number of periods of the alignment mark). A combination of position measurements from different pairs of orders of diffraction may be used to realize a more reliable position measurement.

This technique has also been found to suffer from misalignment errors due to asymmetry induced by substrate processing effects. Ghazanfarian et al do not describe correction of this type of measurement. However, when applied to the detection signal for a pair of orders of diffraction, insufficient information is generally available in this detection signal to fit a sufficient number of hidden parameters for correction of misalignment errors.

Light affected by the substrate contains both positional information (that is, information which is affected by displacement of the substrate) and position invariant information (that is, information which does not change under displacement, at least if uniform lighting is used). Examples of positional information are the phase of light diffracted by a grating, or the position of the image of a feature on the substrate. Examples of invariant information includes the maximum intensity of diffracted or reflected light as a function of position. Normally, only positional information is used for alignment. Embodiments of an apparatus according to an embodiment of the invention are based on the insight that the position invariant information of light that has been affected by a substrate is characteristic of variations that occur in a process step and can therefore be used to identify the variations and the size of the resulting correction that has to be applied to positional information.

In particular, a combination of amplitudes of respective ones of a plurality of different pairs of orders of light diffracted by the alignment mark can be used to correct a position measurement from any single one or more of the pairs of orders. Based only on optical theoretical considerations for arbitrary alignment structures, there is little or no reason to expect that the phase corrections can be determined from the amplitudes, but it has been realized that any given process step can only lead to a predetermined range of variations of the optical properties of the alignment mark, each with its own combined effect upon the amplitudes and the position measurement for different pairs. Thus, a correlation between amplitudes and position errors occurs that can be used to improve position measurement accuracy.

Because the intensities are used to determine the position corrections indirectly by identifying the type of deformation, the correction of position measurement for light of one wavelength need not be based on intensities measured with light of that wavelength, or only on intensities measured with light of that wavelength. Neither do the intensities need to be measured on the same alignment structure as the positions, or indeed on the same substrate: another substrate that has been subject to the same processing may be used to determine the required corrections as well. In some embodiments, amplitude measurements of the orders of diffraction of light of a number of different wavelengths may be used. Thus, the type of position corrections can be identified more accurately.

The phase measurement for different pairs of orders of diffraction may be used in addition to the intensities to determine the size of correction. In this case, a separation between computation of a correction from the amplitudes and correction of the position measurement of from the phase may not be strictly necessary. Where the claims speak of determining a correction "to be used" for determining the size of the correction of position, this feature will be understood to cover both explicit correction and correction that is determined implicitly during a determination of the position measurement from amplitudes and phases. In both cases, position independent information affects the size of correction even if the position dependent phase information does not change.

In order to determine the corrections, use is preferably made of a parametrized model that characterizes physical properties of the alignment structure as a function of position in the alignment structure. For example, such parameters may include the duty cycle of the period of ridges in the alignment structure, the depth of the ridges, edge slope on either side of the ridges, the height of unevenness of plateaus of the ridges and between ridges, position and amplitude of unevenness in a resist layer on top of the ridges, etc. Such structures describing parameters may be used, e.g., to make the model accessible for persons that are not optical experts, but alternatively other types of parameters may be used, such as parametrized approximations of reflection coefficients of the substrate as a function of position.

By means of computations consistent with Maxwell's equations, one can predict for each combination of parameter values both the amplitudes for different orders of diffraction and the corrections of the determination of the position of the alignment structure. In one implementation, the corrections are determined by searching for the values of the parameters that lead to predicted intensities that best fit the measured amplitudes, followed by selection of the corrections that correspond to the selected parameters.

Such a model-based approach may also be applied to alignment systems that do not use periodic alignment structures and/or diffraction amplitudes to obtain position measurements. For example, any type of optical properties may be used to determine parameter values of parameters in a parametrized model of the alignment structure on the substrate, for use in correction position measurements. However, application to measurements using periodic alignment structures has the potential advantage that only a relatively limited number of parameters suffices to characterize the physical properties of the structure, while still describing an alignment structure with a relatively large area.

A lithographic apparatus according to another embodiment of the invention is arranged to compute a relation between one or more parameters of the model and a detection signal of the alignment system consistent with the physical laws of optics (e.g. expressed in mathematical terms, such as Maxwell's equations) for the alignment system, and to determine values of the one or more parameters so that the values correspond to the measured detection signal according to the relation, the position measurement being corrected dependent on the values. By implementing a relation between parameters of the substrate consistent with the physical laws of optics in the lithographic apparatus, it may be possible to avoid a need for extensive calibration of the relation for different lithographic process operations.

A lithographic apparatus according to a further embodiment of the invention provides a set of available parameters whose value can be used to determine the required correction and has an interface for selecting the one or more parameters from the available parameters. Such an apparatus may be arranged to respond to selection of the subset by determining values of only the selected one or more shape parameters in correspondence to the measured detection signal. This facility may be used to enable a user of the lithographic apparatus to identify one or more types of errors for which corrections should be made after a processing operation in terms of physical parameters for which no knowledge of the optical properties of the alignment system may be needed. In addition, the user may specify values for other shape parameters which are not expected to vary after a process operation.

A selection of a combination of parameters that is used for this purpose may be made dependent on the process or processes to which the substrate is subjected prior to alignment, depending e.g. on the nature of the range of variations caused by this process or these processes.

When a model is used that expresses the optical properties as a function of the parameters, a search for the best parameter values may be performed in any known way. For example, a simulated annealing technique may be used, as such a technique may overcome local minima that have been found to occur in models that relate relevant parametrized optical properties of the alignment structure and the intensities of the orders of diffraction.

However, it is not necessary to determine the nature of the deformation of the alignment structure explicitly in terms of physical parameters, as long as the corrections of the phase measurements are determined. For example, a computation of a function may be used that assigns phase corrections to different combinations of intensities. Such a function may be defined specifically for one or more process operations that have been performed prior to alignment. A parametrized function may be used; for example, the value of the parameters may be determined on theoretical grounds or by means of measurements for the one or more process operations. A simple example of such a function is a linear relation between intensity ratios and phase corrections, the parameters being the coefficients of the linear relation. But of course other kinds of functions may be used, such as neural net functions that have been "trained" for the one or more process operations, or even a lookup table with entries for different combinations of intensities, the entries containing the corresponding phase corrections. Such functions, and especially neural net functions, have the potential advantage that little additional computation time may be needed for individual substrates.

According to a further aspect of the invention there is provided a device manufacturing method.

In a method or apparatus according to a further embodiment of the invention, identification of a position correction is made in two or more stages, applying an expectation that the correction (or at least the parameters used to determine the correction) are similar for structures that have been subjected to processing in common (for example, in the same batch or on the same substrate). In such an embodiment, the parameters or correction computed for an alignment structure are used as an initial value in a search for the parameters for a subsequent alignment mark. More generally, a parameter or correction that has been estimated on average for a substrate or batch as a whole may be used to bias the estimate for individual alignment marks or groups of alignment marks.

One such embodiment includes a preselection stage in which, for a batch of a plurality of substrates that have been subjected to a common set of process operations, a subset of available corrections is selected from a first measurement of the intensities of the orders of diffraction and/or other parameters. The embodiment also includes a subsequent stage for selecting a specific correction for an individual alignment structure (or for an individual substrate, or an individual region on such a substrate) from a second measurement of the intensities of the orders of diffraction for that alignment mark (or one or more alignment marks on said individual substrate or in said region). Similarly, instead of or in addition to preselection at the batch level, preselection at the substrate level or region level may be used prior to final selection for an individual alignment structure or region on a substrate. Thus, less computation may be needed to find the corrections for individual alignment marks and/or the consistency of the corrections may be improved.

An alignment subsystem (not shown in FIG. 1) may be included in a lithographic apparatus for accurately measuring the position of substrate W to ensure that substrate W is properly aligned during projection. For example, a alignment subsystem may be needed because the location of substrate W on substrate table WT cannot be controlled with sufficient accuracy. Fluctuations in processing operations may affect the phase shift of different substrates differently. In a semiconductor manufacturing process, for example, substrate (or wafer) W may be subjected to many processing operations, and in between groups of processing operations, the wafer may be placed on a substrate table and illuminated through a mask to ensure location-dependent processing. Prior to illumination, it may be desirable for the mask and the substrate to be aligned, e.g. in order to ensure that the location where the mask is projected onto the wafer corresponds with the positions at which earlier masks have been projected and/or later masks will be projected.

Figure 2:
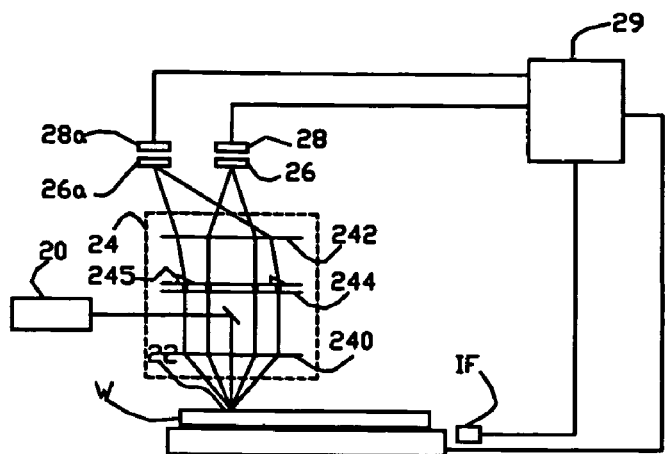
FIG. 2 shows an alignment system according to an embodiment of the invention.

FIG. 2 schematically shows an embodiment of the alignment subsystem, containing an optical subsystem with a radiation source 20, an imaging structure 24, reference structures 26, 26*a,* detectors 28, 28*a* and a processing unit 29. Although processing unit 29 is shown as one element, it will be understood that processing unit 29 may be made up of a number of interconnected processors.

Radiation source 20 (for example, a laser) is arranged to generate a spot of light on an alignment mark 22 on substrate W. For accurate alignment, substrate W may contain an alignment structure with spatially periodic reflection properties in alignment mark 22. Imaging structure 24 contains a lens arrangement 240, 242 to image alignment mark 22 onto reference structure 26. Reference structure 26 has spatially periodic transmissive properties. Detector 28 is arranged to detect a spatially averaged intensity of radiation transmitted by reference structure 26. Detector 28 has an output coupled to an input of processing unit 29, which in turn has a control output coupled to second positioning structure PW, which is coupled to substrate W. Interferometric measuring structure IF has an output coupled to processing unit 29.

It will be understood that various changes may be made to the alignment subsystem without affecting its function. For example, mirrors may be added to be able to move elements of the alignment subsystem to more convenient locations. In one embodiment, the alignment subsystem is immediately next to the projection lens, but it will be understood that the alignment subsystem may be further removed from the projection lens. It is not necessary that the substrate is in the path of the projection beam during alignment. In fact, another substrate (e.g. on a separate substrate table) may even be in the path of the projection beam during alignment.

In operation, radiation from radiation source 20 is reflected from alignment mark 22, and imaging structure 24 uses the reflected radiation to image alignment mark 22 onto reference structure 26. The imaged radiation is partially transmitted by reference structure 26 onto detector 28 which generates an electric signal that is indicative of the spatially averaged intensity of the transmitted radiation.

During alignment, this alignment structure is imaged onto reference structure 26. The spatially averaged amount of light transmitted by reference structure 26 depends periodically on the relative phase of the image of the alignment structure and reference structure 26. Imaging structure 24 passes only selected pairs of orders of diffraction onto reference structure 26. As shown, imaging structure 24 has been designed to filter out selected orders of diffraction from alignment mark 22. For such purpose, imaging structure 24 may contain lenses 240, 242 with a diffraction order filter 244 in between. A first lens 240 maps light diffracted in respective directions to respective positions on diffraction order filter 244, which transmits only light from selected positions. A second lens 242 forms an image of alignment mark 22 from the transmitted light. Thus only selected pairs of orders of diffraction are used for imaging onto reference structure 26. Without such selective transmission position measurement is in principle also possible, but it may have a worse signal-to-noise ratio.

As shown, a number of pairs of diffraction orders of the light from alignment mark 22 may be treated separately. For separate treatment, wedges 246 may be provided to ensure that different pairs of orders are imaged onto different reference structures 26, 26*a,* each provided with its own detector 28, 28*a*. By way of example, elements for measuring intensity of light of only two pairs of orders have been shown: two reference structures 26, 26*a* and corresponding detectors 28, 28*a,* for pairs of diffraction orders +/−1 and +/−2, respectively. However, elements for a greater number of pairs of orders can be realized analogously. It should be understood that in practice a larger number of diffraction orders, for example seven pairs of diffraction orders +/−n (where n=1, 2, 3, 4, 5, 6, 7, . . . ) may be treated separately, e.g. each with its own reference structure and detector.

Processing unit 29 uses a signal (e.g. electric or electronic) from detector 28 to generate control signals for positioning structure PW. Processing unit 29 measures the position of substrate W and the alignment system relative to one another, i.e. it determines for which output value of interferometric measuring means IF substrate W and the alignment subsystem are in a specific alignment relative to one another. Subsequently, processing unit 29 uses this measurement to control one or more positions with a predetermined offset to a position at which substrate W and the alignment subsystem are in alignment, to which substrate is moved for illumination with projection beam PB.

Although single elements 240, 242 have been shown for the sake of simplicity, it should be understood that in practice the imaging structure 24 may comprise a combination of lenses and/or imaging mirrors.

Furthermore, although a configuration has been shown wherein radiation is first reflected from substrate W and then transmitted through reference structure 26 before detection, it should be appreciated that other configurations may be used. For example, radiation reflected off reference structure 26 may be detected and/or radiation transmitted through substrate W may be used (if substrate W permits this). Similarly, radiation may be fed to reference structure 26 first (for reflection or transmission) before being fed to substrate W prior to detection. Also, of course, the invention is not limited to a perpendicular incidence as shown in FIG. 2.

When substrate W is displaced relative to the alignment subsystem in a direction along which optical properties of alignment structure 22 vary periodically, the relative phase of the reference structures 26, 26a and the periods in the images of alignment structure 22 may vary proportionally to the displacement. As a result, the spatially averaged intensity of light passed by reference structures 26, 26a may also vary periodically, e.g. depending on the extent to which blocking parts of the periods of reference structures 26, 26a block the higher intensity parts of the periods of the image of alignment structure 22.

Processing unit 29 determines the amplitude and phase of these periodic variations. The phase is a periodic function of displacement: each time when substrate W has been displaced by a complete period of alignment structure 22, the measured phase values repeat. This effect means that the position can in principle be determined from the phase, except for an ambiguity of an integer number of periods.

Unfortunately, the relation between displacement and measured phase may depend on the way substrate W has been subjected to processing operations. When the processing operations affect the phase measurement, accurate alignment is jeopardized. Measurements made for different instances of the same alignment mark may differ, possibly dependent on both the order and on the alignment mark, as an effect of the processing to which the substrate has been subjected.

Figure 3:
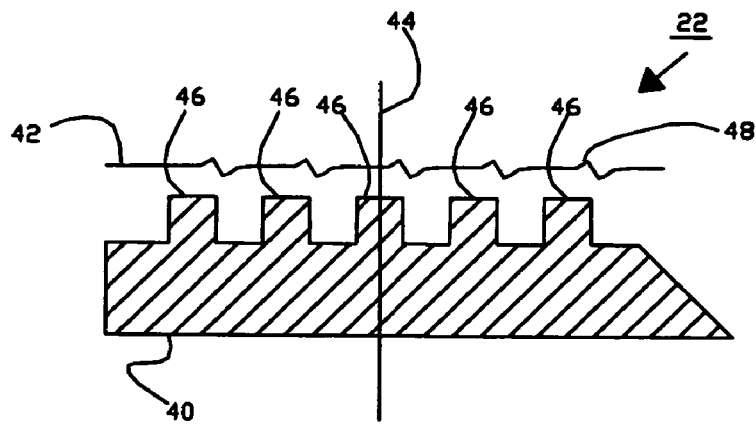
FIG. 3 shows an example of a cross section of a height profile.

FIG. 3 shows an example of a cross section of a height profile of an alignment structure 22. An underlying profiled layer 40 is shown with a resist layer 42 spun onto the profiled layer. Resist layer 42 is effectively transparent at the operating wavelength of the alignment subsystem, so that it merely affects the phase of diffracted light. The profile contains ridges 46 which are repeated a number of times with a basic period L. Ideally resist layer 42 would have the same height everywhere, with the result that the mirror symmetry of profiled layer 40 around line 44 would make the entire structure symmetric.

In the case of a symmetric alignment structure 22 on the substrate, the position of alignment structure 22 can be determined without detailed knowledge of the optical properties. In this symmetric case, symmetry line 44 leads to a symmetry in the periodic variation when the substrate W is displaced relative to the alignment system. This position corresponds to alignment of the symmetry line 44 of alignment structure 22 with a position defined by reference structures 26, 26a. Thus, in case of a symmetric structure, accurate alignment can be realized without more detailed knowledge of the optical properties of alignment structure 22.

However, due to spinning or polishing effects, the thickness of resist layer 42 on different sides of line 44 may differ. By way of example, an unevenness 48 (exaggerated in amplitude) on one side of ridges 46 is shown. Polishing of the substrate also has been found to lead to thickness variations on one side of a ridge 46 in some cases. Such a variation leads to breaking of the symmetry of alignment structure 22 around symmetry line 44. The asymmetry leads to a shift in the phase of the intensity information determined by processing unit 29. In this case, knowledge about the details of the alignment structure may be needed to realize accurate alignment. Dependent on such details, it may be desirable to apply different corrections to the alignment positions determined from phase measurements. It will be appreciated that this dependence may hold not only for spinning or polishing effects but also for any other process effects that affect the symmetry of alignment structure 22.

Processing unit 29 identifies a correction for a position determined from the phase of any one pair of orders or combination of pairs of orders of diffracted light, using a set of measurements of the amplitude of the intensity variations for a plurality of different pairs of orders of diffracted light. A possible justification for this approach is that there is a correlation between the corrections and the amplitudes, because as a result of processing of the substrate only specific corrections can occur in combination with a given set of amplitudes. The dependence of the corrections on the intensities may be determined theoretically: for example, using a model for different possible detailed alignment structures that can result from processing of the substrate, followed by a calculation of the phase corrections and the amplitudes consistent with Maxwell's equations (or any suitable optical approximation of these equations) to determine which phase corrections occur in combination with a given combination of intensities. Alternatively, the corrections may be determined experimentally: for example, by observing possible combinations of intensities and phase corrections for a training set of alignment structures with positions that have been determined separately.

Figure 4:
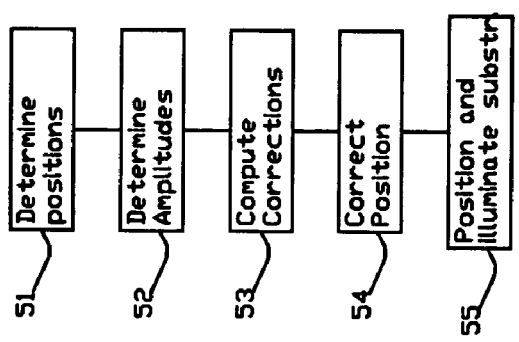
FIG. 4 shows a flow chart for a method of aligning a substrate according to an embodiment of the invention.

FIG. 4 shows a flow chart for a method of aligning a substrate W according to an embodiment of the invention. In a first task 51, processing unit 29 determines phase values $\phi_n$ of respective pairs of orders of diffraction with order +/−n (e.g. from the periodic variations of the intensity of light passed by reference structures 26, 26a for the respective ones of the pairs of orders of diffraction). As is known from the prior art, the phase values are related to offset values $x_n$ of alignment structure 22 according to the expression $\phi_n = 2\pi n x_n/d$ (d being the period size of the alignment structure). In a second task 52, processing unit 29 determines amplitudes $I_n$ of the different orders of diffraction (e.g. from the amplitudes of variations of the output of detectors 28a–g when substrate W is moved relative to the alignment system).

In a third task 53, processing unit 29 uses the set of amplitudes $I_n$ from second step 52 to determine a set of corrections $\Delta x_n$ that should be applied to the positions $x_n$ determined by the phase values $\phi_n$ from first task 51. Third task 53 can be implemented in a number of ways. In one embodiment, a parametrized model of the optical properties of alignment structure 22 is used with variable parameters P, together with a first algorithm for computing one or more predictions of the intensities $I_n(P)$ as a function of the parameters P. In this embodiment, processing unit 29 searches for a set of parameter values P of the model that minimizes a distance (e.g. a difference) between the measured intensities $I_n$ and the predictions $I_n(P)$. The search may be conducted, for example, using a simulated annealing algorithm. Subsequently, processing unit 29 uses a second algorithm to compute the corrections $\Delta x_n(P)$ for parameters that have been found according to a second parametrized model.

In a fourth task 54, the corrections $\Delta x_n$ that have been determined in third task 53 are applied to the positions $x_n$ determined in first task 51. Thus, a consistent set of position measurements is obtained, from which an overall alignment position X may be determined (for example, by averaging the positions $x_n$ over the different orders of diffraction). In a fifth task 55, substrate W is illuminated with beam PB at one or more positions after positioning substrate table WT and patterning structure M relative to one another, so that the pattern is projected at a specified position relative to the position of the alignment structure 22 as determined from the calculated overall alignment position X.

It should be appreciated that various modifications may be applied to an alignment process as described in FIG. 4. For example, instead of computing and applying corrections for individual orders, one may also compute a position from a combination of uncorrected measurements for different orders, followed by correction of the combined result. As another example, in addition to the amplitude measurements, other measured properties of the substrate (such as the variation of the phase values over the different orders) may be used to determine the required corrections. Thus, for example, the model parameters may be fit so as to minimize a distance (e.g. a difference) between predictions and measurements of both phase values and amplitude values. Intensity measurements made with light of the same and/or of other wavelengths than the phase measurements may be used to determine the corrections, whether alone or in combination with intensity measurements made at the other and the same wavelengths. In general, use of amplitudes from more pairs of orders of diffraction may increase accuracy.

One may also determine the corrections using intensity measurement of light diffracted in diffraction orders from one or more reference structures other than the reference structure for which the corrections are determined. These other reference structures may be on the same substrate, or even on one or more different substrates that have been subjected to processing as a batch together with the substrate that contains the reference structure for which the corrections are determined. However, it may be desirable for processing unit 29 to use at least the amplitude measurements made concurrently with the determination of the phase values, i.e. with the same light at the same wavelength. Thus hardly any measuring overhead is required for the correction.

Furthermore, instead of fitting parameter values P in third task 53, the amplitude values and whatever other measurements are used to determine the corrections may be used as an index to retrieve stored information about correction values. Such an arrangement may be realized, for example, by generating the corrections as a parametrized function of the amplitudes, the parameters of the function being trained using e.g. computations of corresponding intensities and corrections as described herein. As a special type of function a neural network function may be used, after similar training of a neural network.

Such a neural network may be trained, or the parameters of the parametrized function may be estimated, for example, by measuring the amplitudes for a test substrate, positioning and illuminating the test substrate W at some position relative to the mask M, and subsequently processing the test substrate so that the relative position of first features determined by the mask and second features of the underlying substrate become detectable. As a first feature, a first rectangle may be used that contains a second rectangle that is used as a second feature. By measuring the relative position of the first and second features, a set of training data may be obtained that describes the corrections for the set of measured amplitudes. Alternatively or in addition, a theoretical model may be used, and training data consistent with this model may be generated. The set of training data may be used to train the neural network e.g. using a known neural-network training algorithm.

Good results have been obtained, for example, with a neural network that uses input signals that encode the amplitude of seven pairs of orders of diffraction for two colors (14 signals) and the phase of these pairs of orders (another 14 signals). In this example, weighted sums of these input signals are applied to six neurons with, for example, S-shaped response functions. A weighted sum of the outputs of these neurons is fed to an output neuron with a linear response function, which represents the estimated position. The weight values used in the weighted sums are determined by neural-network training by means of examples. Thus significantly improved positioning was achieved. In addition to the single output neuron for position, more output neurons may be used to estimate other parameters such as shape parameters of the alignment marks.

Alternatively, parameters of the parametrized function may be estimated (e.g. coefficients of a linear or polynomial function): for example, using an estimate that minimizes distance (e.g. a least-squares difference) between the predicted and measured corrections for a plurality of training sets.

Similarly, training data may be obtained from other measurements of the actual correction, performed e.g. by removing part of the photosensitive layer and measuring the correction between measurements made where the layer is present and where the layer has been removed.

Similarly, this type of training data may be obtained for training the computation of the offset if other measurements than the amplitudes are used.

In principle, the corrections may be computed anew for every alignment structure 22. Since the corrections may be affected or determined by processing operations to which an entire substrate W is subjected, or even a batch of such substrates, the corrections needed for different alignment structures on the same substrate or on different substrates may be correlated as well. Accordingly, intensity measurements for one or more different reference structures on the substrate, or on other substrates from the same batch, may be used to initialise or constrain the search for parameter values P that best fit the intensity measurements. Thus, less searching may be required.

Advantageously processing unit 29 is programmed with a physical model, which relates shape parameters of alignment mark 22 to measured parameters such as the phase and amplitude of the periodic variations of the intensity at detectors 28, 28a consistent with Maxwell's equations. Such physical models are known per se. For example, such a physical model may use a complex reflection coefficient function $\Gamma_k(r)$ as a function of coordinates r=(x,y) of position in an arbitrary virtual plane at substrate W (k being the wave-vector of the incoming light). The function $\Gamma_k(x,y)$ determines the refracted amplitude and phase exp(jk.r)*$\Gamma_k$(x,y) of the light at position x, y in said plane in response to an incident field exp(jk.r). When $\Gamma_k(x,y)$ is known, a well-known and straightforward mathematical relation exists for computing the measured parameters at detectors 28, 28*a* from $\Gamma_k(x,y)$. Given the shape parameters of alignment mark 22 and the optical properties of its material in turn, $\Gamma_k(x,y)$ can readily be computed.

In a structure as shown in FIG. 3, for example, it may be desirable in applying such an approach to use parameters characterizing features such as the size and height of ridges 46, the reflectivity of the material of profiled layer 40, the transmission coefficient of resist 42, and the amplitude and/or scale of the unevenness 48 due to spinning or polishing. Processing unit 29 may be programmed to compute $\Gamma_k(x,y)$ from values of these parameters and to compute the amplitude and phase of the intensity variations at detectors 28, 28*a* from $\Gamma_k(x,y)$ given the properties of light source 20. For the computation of $\Gamma_k(x,y)$, known techniques such as the RCWA technique may be used, but often a simple model may suffice, such as the vertical propagation model, which computes $\Gamma_k(x,y)$ from the reflection coefficient of profiled layer 40 at given points of on the layer and at a given angle of incidence from the properties of the material of that layer and its local orientation, with a phase correction to account for propagation through the overlying layer. By applying inverse modeling, values of the parameters may be estimated that fit the measured amplitudes to the computed amplitudes. Processing unit 29 may compute the computed parameters and/or corrections of position measurements obtained from the phase values.

It will be appreciated that such a technique is not limited to a phase grating alignment sensor as shown in FIG. 2. It may also be applied to other sensors, e.g. a correlation sensor that forms an image of a non-periodic alignment structure and computes a correlation coefficient between this image and a reference image, estimating the position of the substrate from the location of the maximum of the correlation coefficient; or a sensor that detects edges between features in an image of the (not necessarily periodic) alignment structure and measures the position of these edges to estimate the position of the alignment structure; or any other optical sensor. In each case, a model can be programmed that relates shape parameters of the alignment structure to measured quantities such as correlation as a function of position, image edge profile etc., from which the parameters can be estimated and used to correct the measured position.

By supplying a model expressed in terms of parameters of the substrate that are adjustable during alignment (as far as relevant for the optical properties of the alignment structure) and computing the optical relation between those parameters and quantities measured by the alignment system during alignment, one may obviate a need to provide extensive position measurements to calibrate the position corrections. The model may be expressed in any terms. Preferably, shape parameters are used, which parametrize the geometrical form of structures on the substrate such as ridges. Examples of such parameters are parameters describing edge slope of ridges on either side of the ridges, slopes of the platform at the top of the ridges and the valleys between the ridges, edge height or depth, layer thickness of a layer on top of ridges, etc. In addition, other parameters may be given for which fixed values are set a priori before alignment.

Alternatively, or in addition, non-geometrical parameters may be used, such as the refractive index of the material in layers on the substrate, or the reflection coefficient of material used for the structures. These parameters can usually be set a priori. As yet another alternative, optical parameters may be used, such as coefficients that describe a piecewise approximation of $\Gamma_k(x,y)$ at or near the surface of the alignment structure in a direction along which the alignment structure varies periodically (e.g. in terms of a polynomial approximation). The pieces of the piecewise approximation in this case may correspond approximately to successive structures on the substrate in the alignment structure. Such parameters are equivalent to more structural parameters as far as the optical effects are concerned. Of course, in case of such parameters, also some of the parameters may be fixed a priori and for others, values may be determined during alignment.

It may be desirable to program processing unit 29 to be able to perform such computation using any combination of a programmed set of parameters. In a further embodiment, processing unit 29 is provided with an interface for commanding processing unit 29 to select which of the set of available parameters should be used. The interface may include, for example, a keyboard for entering a selection of the parameters, or a network connection (not shown) along which a Computer Aided Manufacturing system signals a selection of these parameters to processing unit 29. Thus technologists, who know the processes used to process the substrate and the values of parameters that are likely to result from these processes as well as the parameters that are likely to be variable, may be able to adapt operation of the alignment system without knowledge of optical properties of the alignment subsystem.

The parameters for which values may be selected during alignment need not be selected explicitly each time. Instead, processing unit 29 may contain stored subset selections, so that the interface need only specify one of the stored subsets. In addition, the interface may be used to specify values for the unselected parameters and ranges or mean values for the selected parameters.

Using information from the interface, processing unit 29 may adapt the computation of the parameters as selected, and correct the position measurements according to the parameters that have thus been computed. In this way a user can modify the operation of processing unit dependent on the type of processing to which substrate W has been subjected prior to alignment.

Embodiments of the invention may be adapted for use with a lithographic projection apparatus that includes a radiation system for providing a projection beam of radiation; a support structure for supporting a patterning structure, the patterning structure serving to pattern the projection beam according to a desired pattern; a substrate table for holding a substrate that comprises an alignment structure; a projection system for projecting the patterned beam onto a target portion of the substrate; and an alignment system. Embodiments of the invention also include device manufacturing methods.

Whilst specific embodiments of the invention have been described above, it will be appreciated that the invention as claimed may be practiced otherwise than as described. It is explicitly noted that the description of these embodiments is not intended to limit the invention as claimed.

The invention claimed is:

1. A lithographic projection apparatus comprising:
a support structure configured to support a patterning structure, the patterning structure being configured to pattern a beam of radiation according to a desired pattern;
a substrate table configured to hold a substrate including an alignment structure having spatially periodically varying optical properties; and
an alignment system configured to obtain positional information from light affected by the substrate, to determine a position of the alignment structure relative to the patterning structure based on the positional information, and to control a relative positioning of the patterning structure and the substrate based on the determined position,
wherein the alignment system is further configured to obtain position-invariant information from light affected by the substrate and to determine, based on the position-invariant information, a correction to the determined position of an alignment structure, wherein the alignment structure is selected from among (1) the substrate, (2) another substrate that has been subjected to a processing operation in common with the substrate, or (3) a further substrate that has been subjected to a further processing operation according to the same value of a processing parameter used to subject the substrate to the further processing operation.

2. The lithographic projection apparatus according to claim 1, wherein the alignment system is configured to measure a phase value of light diffracted by the alignment structure and to determine the position of the alignment structure based on the phase value.

3. The lithographic projection apparatus according to claim 1, wherein the alignment system is arranged to measure intensities of individual pairs of diffraction orders of light diffracted by the alignment structure.

4. The lithographic projection apparatus according to claim 3, wherein the alignment system is arranged to measure a phase value for at least one pair of diffraction orders, the correction being based on the phase value and the measured intensities.

5. The lithographic projection apparatus according to claim 3, wherein the alignment system includes a model describing at least one position-dependent optical effect of the alignment structure, and
wherein the alignment system is arranged to compute information about a difference between (1) the measured intensities and (2) corresponding values based on the model and to estimate at least one value of the position based on a parameter of the model that minimizes the difference.

6. The lithographic projection apparatus according to claim 3, wherein the alignment system includes a model describing at least one position-dependent optical effect of the alignment structure, and
wherein the alignment system is arranged to estimate a value of a parameter of the model that corresponds to at least one of the measured intensities and to determine the correction based on the estimated value.

7. The lithographic projection apparatus according to claim 6, wherein the alignment system is arranged to compute information about a difference between the measured intensities and values of the intensities according to the model and to determine the at least one estimated value so as to minimize the difference.

8. The lithographic projection apparatus according to claim 6, wherein the alignment system includes a set of available parameters of the model, and
wherein the alignment system comprises an interface configured to permit selection of at least one parameter from the set of available parameters, the correction being based on an estimated value of the at least one selected parameter.

9. The lithographic projection apparatus according to claim 8, wherein the alignment system is configured to determine the correction independent of a parameter of the set of available parameters that is not selected.

10. The lithographic projection apparatus according to claim 6, wherein the parameter of the model describes a geometrical property of the alignment structure.

11. The lithographic projection apparatus according to claim 1, wherein the alignment system includes a phase grating alignment system.

12. The lithographic projection apparatus according to claim 1, wherein the alignment system is arranged to measure position-invariant information from light of a plurality of wavelengths, and
wherein the correction is based on the position-invariant information from light of a plurality of wavelengths.

13. The lithographic projection apparatus according to claim 1, said apparatus further comprising a neural network configured to determine the correction.

14. A lithographic projection apparatus comprising:
a support structure configured to hold a patterning structure, the patterning structure being configured to pattern a beam of radiation according to a desired pattern;
a substrate table configured to hold a substrate having an alignment structure; and
an alignment system configured to measure properties of light affected by the alignment structure, to determine a position of the alignment structure relative to the patterning structure based on the measured properties, and to control a relative positioning of the patterning structure and the substrate based on the determined position,
wherein the alignment system includes a model describing physical properties of the alignment structure, as a function of position, and
wherein the alignment system is arranged to estimate a value of a parameter of the model that corresponds to at least one of the measured properties and to determine a correction to the determined position based on the estimated value.

15. The lithographic projection apparatus according to claim 14, wherein the alignment system is arranged to compute information about a difference between the measured properties and values of the properties according to the model and to determine the at least one estimated value so as to minimize the difference.

16. The lithographic projection apparatus according to claim 14, wherein the alignment system includes a set of available parameters of the model, and
wherein the alignment system comprises an interface configured to permit selection of at least one parameter from the set of available parameters, the correction being based on an estimated value of the at least one selected parameter.

17. The lithographic projection apparatus according to claim 14, wherein the parameter of the model describes geometrical properties of the alignment structure.

18. A device manufacturing method comprising:
using a patterning structure to pattern a beam of radiation according to a desired pattern;
determining a position, relative to the patterning structure, of an alignment structure having spatially periodically variable optical properties, wherein the position is determined during alignment using both positional information from light affected by a substrate having the alignment structure and position-invariant information from the light affected by the substrate;
determining, based on the position-invariant information, a correction to the determined position of an alignment structure; and
controlling a relative positioning of the patterning structure and the substrate, based on the corrected determined position;
wherein the alignment structure is selected from among (1) the substrate, (2) another substrate that has been subjected to a processing operation in common with the substrate, and (3) a further substrate that has been subjected to a further processing operation according to the same value of a processing parameter used to subject the substrate to the further processing operation.

19. The device manufacturing method according to claim 18, wherein said determining a position includes measuring a phase value of light diffracted by the alignment structure and determining the position of the alignment structure based on the phase value.

20. The device manufacturing method according to claim 18, wherein said determining a position includes measuring intensities of individual pairs of diffraction orders of light diffracted by the alignment structure.

21. The device manufacturing method according to claim 20, wherein determining the correction includes measuring a phase value for at least one pair of diffraction orders, the correction being based on the phase value and the measured intensities.

22. The device manufacturing method according to claim 20, wherein determining the correction includes applying a model describing at least one position-dependent optical effect of the alignment structure, computing information about a difference between (1) the measured intensities and (2) corresponding values based on the model, and estimating at least one value of the position based on a parameter of the model that minimizes the difference.

23. The device manufacturing method according to claim 20, wherein determining the correction includes applying a model describing at least one position-dependent optical effect of the alignment structure, and
wherein said applying a model includes estimating a value of a parameter of the model that corresponds to at least one of the measured intensities, and
wherein the correction is based on the estimated value.

24. The device manufacturing method according to claim 23, wherein said applying the model includes computing information about a difference between the measured intensities and values of the intensities according to the model and determining the at least one estimated value so as to minimize the difference.

25. The device manufacturing method according to claim 23, wherein determining the correction includes selecting at least one parameter from among a set of available parameters of the model, the correction being based on an estimated value of the at least one selected parameter.

26. The device manufacturing method according to claim 25, wherein determining the correction is performed independently of a parameter of the set of available parameters that is not selected.

27. The device manufacturing method according to claim 23, wherein the parameter of the model describes a geometrical property of the alignment structure.

28. The device manufacturing method according to claim 18, wherein said obtaining position-invariant information includes measuring position-invariant information from light of a plurality of wavelengths, and
wherein the correction is based on the position-invariant information from light of a plurality of wavelengths.

29. The device manufacturing method according to claim 18, wherein said determining a correction includes using a neural network.

30. A device manufacturing method comprising:
using a patterning structure to pattern a beam of radiation according to a desired pattern;
measuring properties of light affected by the alignment structure;
determining a position of the alignment structure relative to the patterning structure based on the measured properties;
controlling a relative positioning of the patterning structure and the substrate, based on the determined position;
wherein said determining the position includes applying a model during alignment that describes physical properties of the alignment structure as a function of the position, estimating a value of a parameter of the model that corresponds to at least one of the measured properties, and determining a correction to the determined position based on the estimated value.

31. The device manufacturing method according to claim 30, wherein said applying the model includes computing information about a difference between the measured properties and values of the properties according to the model and determining the estimated value so as to minimize the difference.

32. The device manufacturing method according to claim 30, wherein determining the correction includes selecting at least one parameter from among a set of available parameters of the model, wherein the set is based on the nature of processing steps to which the substrate has been subjected.

33. The device manufacturing method according to claim 30, wherein the parameter of the model describes a geometrical property of the alignment structure.

34. The device manufacturing method according to claim 30, wherein determining the position includes using the estimated value to select an initial value in a search for at least one further parameter,
wherein the method further comprises using the at least one further parameter to determine a position of at least one of (1) a further alignment structure on said substrate and (2) an alignment structure on a further substrate.

* * * * *